United States Patent
Catovic et al.

(10) Patent No.: US 8,441,883 B2
(45) Date of Patent: May 14, 2013

(54) MEMORY ARRANGEMENT FOR ACCESSING MATRICES

(75) Inventors: Edvin Catovic, Gothenburg (SE); Bjorn Ulf Anders Sihlbom, Vastra Frolunda (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 184 days.

(21) Appl. No.: 12/939,010

(22) Filed: Nov. 3, 2010

(65) Prior Publication Data

US 2012/0106287 A1    May 3, 2012

(30) Foreign Application Priority Data

Nov. 1, 2010  (WO) .................. PCT/EP2010/066567

(51) Int. Cl.
*G11C 8/00*  (2006.01)

(52) U.S. Cl.
USPC ............. 365/230.03; 365/230.05; 365/230.06

(58) Field of Classification Search ............. 365/230.03, 365/230.05, 230.06
See application file for complete search history.

(56) References Cited

U.S. PATENT DOCUMENTS

| | | | | |
|---|---|---|---|---|
| 6,339,541 | B1 * | 1/2002 | Hardee et al. | 365/230.03 |
| 6,373,774 | B2 * | 4/2002 | Ishikawa et al. | 365/230.03 |
| 6,418,067 | B1 * | 7/2002 | Watanabe et al. | 365/230.03 |
| 6,584,033 | B2 * | 6/2003 | Ayukawa et al. | 365/230.03 |
| 6,604,166 | B1 | 8/2003 | Jana et al. | |
| 6,728,159 | B2 * | 4/2004 | Anand et al. | 365/230.03 |
| 7,254,680 | B2 * | 8/2007 | Ayukawa et al. | 365/230.05 |
| 7,587,545 | B2 * | 9/2009 | Kashiwaya et al. | 365/230.03 |
| 2008/0316835 | A1 | 12/2008 | Chen et al. | |

FOREIGN PATENT DOCUMENTS

EP    1936628 A1    6/2008

OTHER PUBLICATIONS

International Search Report and Written Opinion issued on Jul. 28, 2011, in corresponding PCT Application No. PCT/EP2010/066567, 10 pages.

* cited by examiner

*Primary Examiner* — Trong Phan
(74) *Attorney, Agent, or Firm* — Rothwell, Figg, Ernst & Manbeck, P.C.

(57) ABSTRACT

A memory arrangement is provided having a plurality of memory elements, the elements being associated with a memory space that can be addressed in a row and column fashion during a write or a read access. The memory arrangement further includes a first macro bank comprising a first plurality of memory cells comprising a first subset of the memory elements and a second macro bank comprising a second plurality of memory cells comprising a second subset of the memory elements. The memory arrangement further includes an address resolution stage for addressing the memory cells in the respective macro banks. The memory cells are arranged so that the memory space is partitioned into a plurality of non-overlapping basic matrices, whereby each basic matrix is mapped to a given macro bank and wherein the memory cells are arranged logically so that the memory space is partitioned into a plurality of non-overlapping logic matrices of a given size, each logic matrix being of a size equal or larger than a basic matrix.

18 Claims, 9 Drawing Sheets

MACRO BANK
ADDRESS

| $A_b$ | | | | |
|---|---|---|---|---|
| 0 | 0 | 1 | 2 | 3 |
| | 4 | 5 | 6 | 7 |
| | 8 | 9 | 10 | 11 |
| | 12 | 13 | 14 | 15 |
| 1 | | | | |

FIG. 10

MEMORY CELL
ADDRESS

| $A_{bx}$ | RC0 | RC1 | RC2 | RC3 |
|---|---|---|---|---|
| 0 | 0 | 1 | 2 | 3 |
| 1 | 7 | 4 | 5 | 6 |
| 2 | 10 | 11 | 8 | 9 |
| 3 | 13 | 14 | 15 | 12 |

FIG. 11

| 0 | RC0 | RC1 | RC2 | RC3 |
|---|---|---|---|---|
| | RC1 | RC2 | RC3 | RC0 |
| | RC2 | RC3 | RC0 | RC1 |
| | RC3 | RC0 | RC1 | RC2 |
| 1 | | | | |

FIG. 12

1A. ACCESS PARAMETERS
↓
2A. TRANSFORM INTO RESOLVED ADDRESS A
↓
3A. CREATE MACRO BANK ADDRESSES $A_0, A_1...A_b$; a; A(0)
↓
4A. CREATE MEMORY CELL ADDRESSES $A_{00}, A_{01}...A_{03}$
↓

FIG. 13

MEMORY ARRANGEMENT FOR ACCESSING MATRICES

This application claims priority to PCT Application No. PCT/EP2010/066567, filed Nov. 1, 2010, the contents of which are incorporated herein by reference.

TECHNICAL FIELD

This invention is directed to arrangements and methods for accessing and storing data in memory elements, such as random access memories.

BACKGROUND

Many traditional memory architectures usually implement a linear address space. On each clock cycle random access to any word in the address space is possible. Although such architecture is general and allows storage of matrices, the architecture is not suitable for efficient and/or robust matrix processing in digital signal processing (DSP) hardware (HW). Further, parallel access to several matrix elements is not possible limiting the maximum memory bandwidth. Random access to complete address space allows undesirable effects such as overlapping matrices and memory fragmentation.

US 2008316835 discloses an N-dimension addressable memory optimized for random matrix operations. The memory includes an N-dimension array of bit cells and logic configured to address each bit cell using N-Dimension Addressing (NDA), where N is at least two and the array of bit cells is addressable by N orthogonal address spaces. Each bit cell of the N-dimension addressable memory includes a bit storage element, N word lines, and N bit lines.

According to FIGS. 4A and 4B of US 2008316835 there is illustrated an addressing scheme for a 2-Dimension Word Addressable (DWA) memory in accordance with at least one embodiment. In FIG. 4A, Address (1) (Addr (1)) is used to address sixteen 2-bit words. Each of the 2-bit words (e.g., 0-15) represents a 2-element row of a target matrix data. In FIG. 4B, Address (2) (Addr (2)) is used to address eight 4-bit words (e.g., 0-7). Each of the 4-bit words represents a 4-element column of a target matrix data. For exampled for a read operation, a 4-bit output of the column data in matrix 1, column 1 can then be obtained in a single operation. Likewise, for a write operation, 4-bit data can be stored to matrix 1, column 1 in a single operation.

If an application requires the reading of bit 2 of the words 0, 1, 2 and 3 as indicated by reference 120, in FIG. 1B of US 2008316835 using a conventional single ported memory, it will require four memory access cycles to read all four words. Then, additional operations will be needed to extract the bit 2 information individually. In contrast, an exemplary embodiment of US20083116835 allows for the data to be accessed in a single memory cycle.

Prior art document U.S. Pat. No. 6,604,166 shows an n-dimensional addressable memory arrangement which allows parallel access to of a plurality of data elements along any dimension of an n-dimensional data array. To enable parallel access of s data elements along any dimension, the data elements of n-dimensional data array are mapped to s parallel memory banks in such a way that consecutive s data elements along any dimension are mapped to different memory banks. This mapping is defined by two functions, which define the memory bank number and location within a memory bank for each data element in n-dimensional data array. Generic function pairs are described for all combinations of (n, s). Two particular instances of the mapping, namely circular permutation (rotation) along 0'th dimension and dyadic permutation along 0th dimension have been discussed in detail.

The basic architecture for proposed memory for (m,n)-hyper-matrix is shown in FIG. 3 of U.S. Pat. No. 6,604,166. For storing the s-data elements of any data vector into the memory banks, the n-dimensional starting index, the dimension along which the data is to be stored, and the s data elements are provided to this architecture. For reading s data elements in parallel, the n-dimensional starting index and the dimension of access are provided to the memory architecture. Based on these, the addresses for all of s banks 34 are computed by address generation logic 31 and issued to the banks 34 after carrying out a permutation (rearrangement) by permutation logic 32, which ensures that only the required locations are accessed in each bank. The inverse permutation logic 33 for the data read from (written into) the memory is inverse (same) of Permutation logic 32 for addresses.

The above documents are associated with certain restrictions as to how matrix calculations can be performed.

SUMMARY

It is a first object of the invention to set forth a memory arrangement in which the size and location of matrices, for the purpose of reading or writing, can be specified in a flexible manner.

This object has been achieved by a memory arrangement having a plurality of memory elements, the elements being associated with a memory space which can be addressed in a row and column fashion during a write or a read access, the memory arrangement comprises a first macro bank comprising a first plurality of memory cells, the first plurality of memory cells comprising a first subset of the memory elements; a second macro bank comprising a second plurality of memory cells, the second plurality of memory cells comprising a second subset of the memory elements; an address resolution stage for addressing the memory cells in the respective macro banks, wherein the memory cells are arranged so that the memory space is partitioned into a plurality of non-overlapping basic matrices; whereby each basic matrix is mapped to a given macro bank and wherein the memory cells are arranged logically so that the memory space is partitioned into a plurality of non-overlapping logic matrices of a given size, each logic matrix being of a size equal or larger than a basic matrix. The address resolution stage is adapted for transforming a logic address as designating the location of the memory element in the logic matrix and the location of the logic matrix in the memory space and a direction indicating either row or column access of the memory space and the size of the logic matrix into a resolved address. The memory arrangement further comprises algorithm functions which transform the resolved address into a set of macro bank addresses, which by each macro bank again are transformed into a plurality of memory cell addresses. The memory cell addresses points out elements of given memory cells of each macro bank.

It is a secondary object of the invention to set forth a method for a memory arrangement in which the size and location of sub-matrices, for the purpose of reading or writing, can be specified in a flexible manner.

Hence, there is provided a method for a memory arrangement having a plurality of memory elements, the elements being associated with a memory space which can be addressed in a row and column fashion during a write or a read access, the memory arrangement comprising; a first macro bank comprising a first plurality of memory cells, the first plurality of memory cells comprising a first subset of the memory elements; a second macro bank comprising a second plurality of memory cells, the second plurality of memory cells comprising a second subset of the memory elements; an address resolution stage for addressing the memory cells in the respective macro banks, wherein the memory cells are arranged so that the memory space is partitioned into a plurality of non-overlapping basic matrices; whereby each basic matrix is mapped to a given macro bank. The memory cells are arranged logically so that the memory space is partitioned into a plurality of non-overlapping logic matrices of a given size, each logic matrix being of a size equal or larger than a basic matrix; the method comprising the steps of transforming a logic address as designating the location of the memory element in the logic matrix and the location of the logic matrix in the memory space and a direction indicating either row or column access of the memory space and the size of the logic matrix into a resolved address, transforming the resolved address into a set of macro bank addresses, transforming the set of macro bank addresses into a plurality of memory cell addresses; the memory cell addresses pointing out of given memory cells of each macro bank.

The above features render various calculation tasks, particular matrix operations, more efficient for a given hardware cost.

According to a further aspect of the invention, there is provided a memory arrangement wherein the size of the logic matrix may be changed from memory access to memory access.

According to a further aspect of the invention, the partitioning of the memory space into basic matrices and the mapping of memory elements of each basic matrix on memory cells is such that for an access of reading or writing k memory elements of either a row or a column direction covering at least two basic matrices, at least two different memory banks are accessed wherein for any said basic matrix any given memory cell is accessed only once, independently of whether a row or a column is accessed, thereby allowing for parallel access to said k elements.

According to still further aspects of the invention, k elements of a row or a column are mapped on macro-banks during write operation as a vector with k elements, the vector being partitioned into ceil(k/B) sub-vectors, whereby each sub-vector vector is rotated A(0)=A mod B positions, corresponding to the length of a sub-vector, and wherein the rotated sub-vectors is mapped on different macro banks.

According to still further aspects of the invention, the memory arrangement further comprises a, logical address resolution stage, first algorithm function and second algorithm function, and first and second permutation blocks.

According to still further aspects of the invention, the access parameters relating to the logical address is provided to the address resolution stage, wherein in address resolution stage, the resolved address is resolved and delivered to the first algorithm function and the second algorithm function, wherein the first algorithm function provides the macro bank address to the first memory bank and the second algorithm function provides the macro bank address to the second memory bank.

According to still further aspects of the invention, the first algorithm function provides further the least significant bit of the resolved address to the first and second permutation blocks.

According to one embodiment of the invention, wherein exclusively two macro banks are provided, the rotation in the first and the second permutation blocks is being given by the least significant bit of the resolved address, whereby a rotation of the two sub vectors is made or no rotation is done, the potentially rotated sub vectors being provided to the respective macro banks.

According to still further aspects of the invention, during a read operation, a permutation of first read data elements provided from read ports of macro banks is performed in second permutation block, wherein Bit 0 of resolved address is provided to second permutation block, giving a number of shift positions so as provide permuted read data, being identical with the write data originally entered in the memory arrangement.

Further advantages of the invention will appear from the following detailed description of the invention.

BRIEF DESCRIPTION OF THE DRAWINGS

FIG. 1 shows an example according to the invention, where a memory space is partitioned into an array of basic matrices and where each basic matrix of the memory space are mapped on a first macro bank (MB0/0) and a second macro bank (MB1/1) respectively according to the invention, FIG. 2 shows another general example according to the invention of a macro bank mapping where an array of basic matrices is mapped on a range of macro banks (0; p−1), FIGS. 10 and 11 shows one exemplary mapping of the logical memory elements of one basic matrix (size G×G=4×4 elements) on physical memory cells RC0-RC3 of FIG. 9 according to the first embodiment of the invention, FIG. 12 is another representation of the mapping of elements of a basic matrix on memory cells of FIGS. 10 and 11, FIG. 13 shows a method according to the invention.

DETAILED DESCRIPTION OF PREFERRED EMBODIMENTS OF THE INVENTION

According to the invention there is provided a physical memory arrangement comprising a plurality of memory cells, which may be implemented by means of e.g. RAM (Random Access Memory). For addressing the physical memory, a two dimensional addressable logical memory space 20 is provided, covering a plurality of memory elements 3. The logical memory space 20 comprises logic matrices. The logical addressing scheme and memory arrangement according to the invention can be used for various matrix operations or calculation applications.

According to a first embodiment of the invention, the following applies for the logical memory space:
1. The memory architecture is matrix oriented. On each access, the architecture is capable of a dynamic reconfiguration of the addressable logical memory space in logical matrices of different sizes.
2. For each configuration, the logical matrices are non-overlapping.
3. Within each logical matrix it is possible to access up to k consecutive elements in row-wise or column-wise fashion.

The implementation into a memory arrangement according to the invention is hierarchical with two hierarchy levels:
1. At the first hierarchy level the logical memory space is partitioned and mapped on a number of macro-banks. This level will be explained in the following referring among others to FIG. 7.
2. The second level of hierarchy implements macro-banks using memory cells such as standard Random Access Memory (RAM) cells. This level will be explained in the following referring among others to FIGS. 9, 10 and 11.

Logical Memory Space

The logical memory space is moreover partitioned into an array of basic matrices. A basic matrix is the smallest addressable matrix in the logical memory space. The Partitioning of the logical memory address space provides a basis for addressing matrices of different sizes.

The partitioning is defined by the parameter G, whereby the matrix memory is partitioned in array of (N/G)*(N/G) basic matrices of size G*G. G also denotes the number of memory cells used per macro bank and shall be referred to as the granularity.

Figures 1, 2:
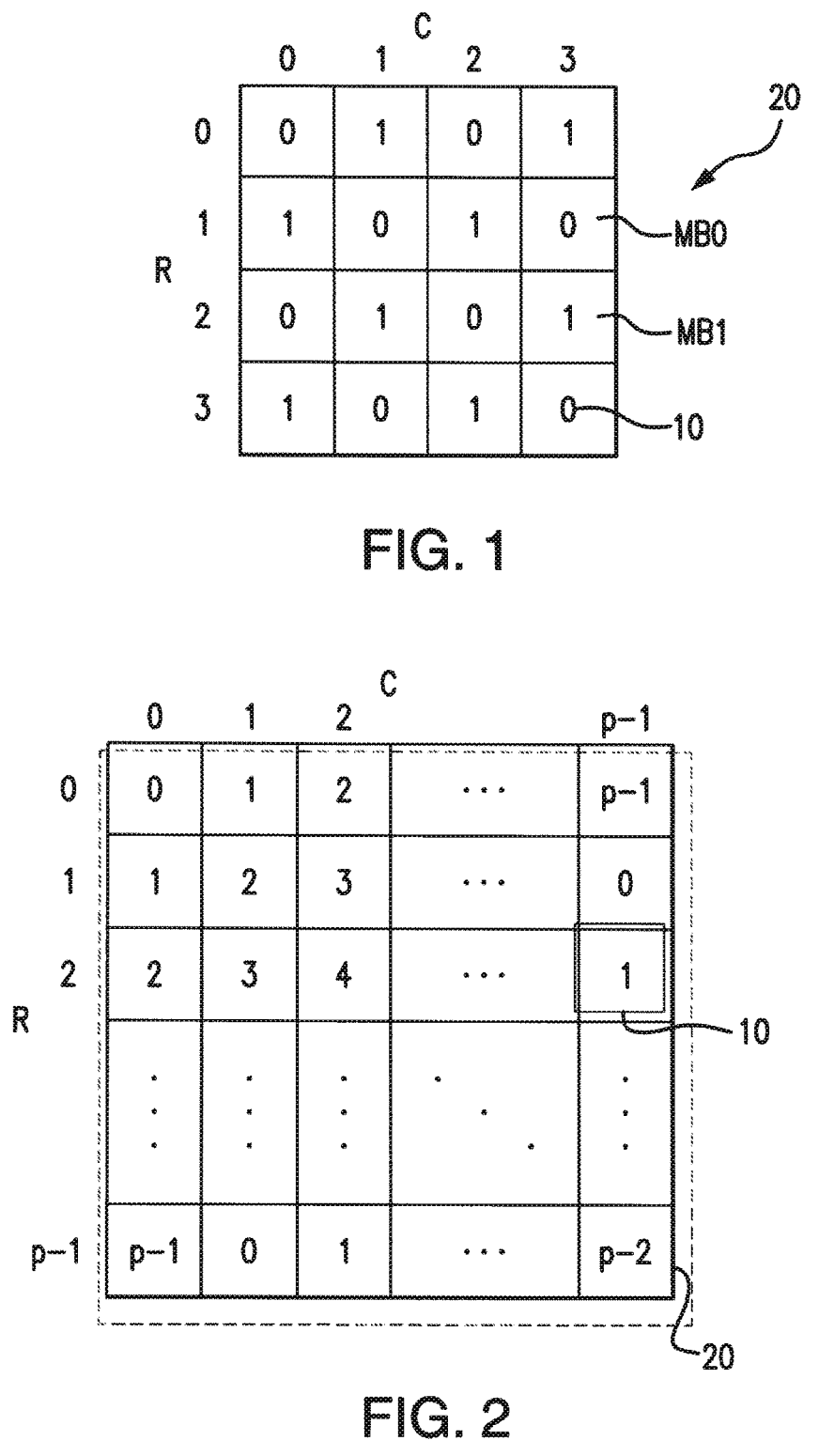

FIG. 1 shows an example according to a first embodiment of the invention, where the logical memory space 20 is partitioned into an array of basic matrices 10 on column C and row R. Each basic matrix of the memory space is mapped on a first macro bank (MB0/0) or on a second macro bank (MB1/1), respectively. This partitioning of the logical memory space provides a basis for addressing logical matrices of different sizes.

FIG. 2 shows another embodiment according to the invention of a macro bank mapping where an array of basic matrices is mapped on a wider range of macro banks (0; p−1).

Figure 3:
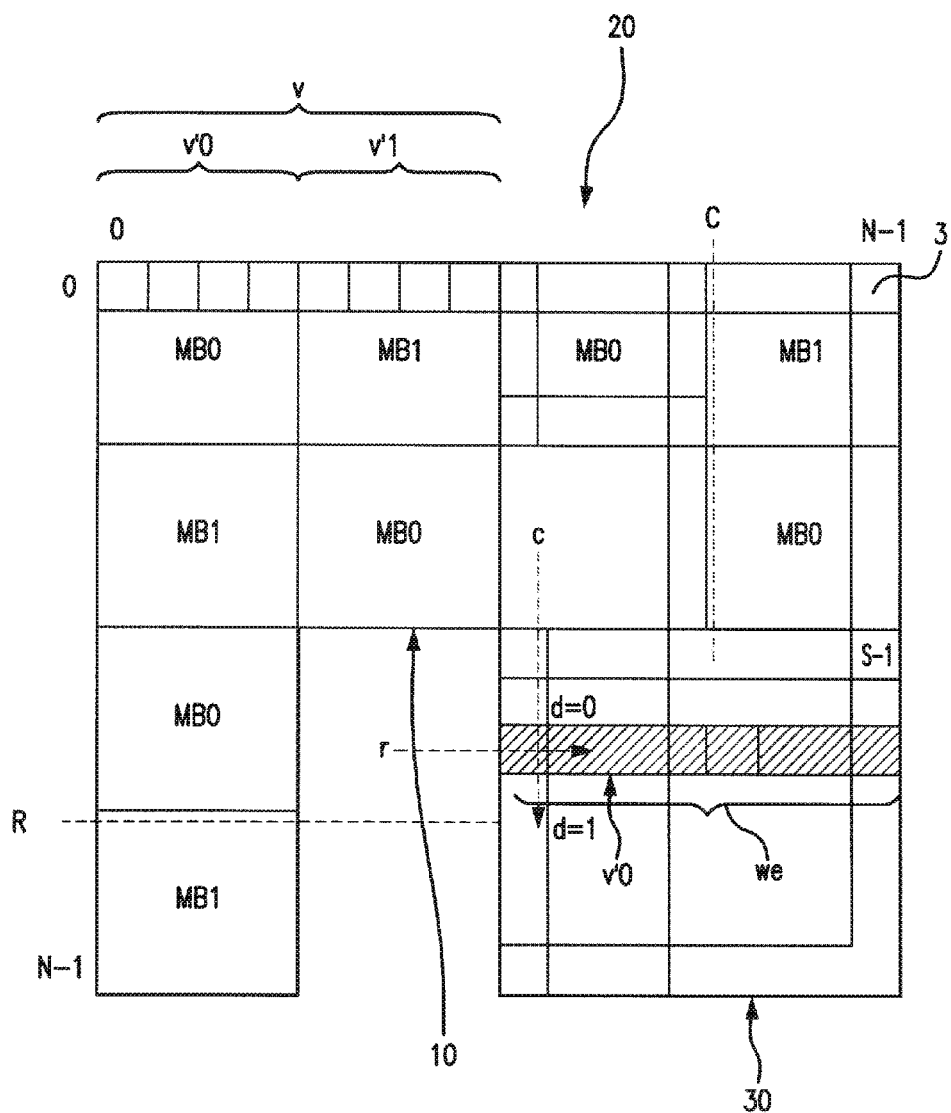
FIG. 3 shows a schematic representation of a memory space and corresponding addressing scheme according to the invention, which is partitioned into a first plurality of non-overlapping basic matrices that are mapped on two exemplary physical macro banks according to the invention, the memory space moreover comprising a plurality of logic matrices, also being non-overlapping with one another and forming the memory space.

FIG. 3 shows a general representation of the logical two-dimensional memory space 20 according to the invention, which space is partitioned into an addressing scheme comprising a first plurality of non-overlapping basic matrices 10 which are mapped on various macro banks according to the invention. The logical memory space is moreover arranged into a plurality of non-overlapping logic matrices 30.

Moreover, FIG. 3 shows the first level of the memory hierarchy with macro-bank organization. The macro bank mapping is denoted MB0 and MB1. For instance, one particular basic matrix 10 is mapped on MB0. On a write operation, the macro-banks store up to k elements of the write data on a row or a column of the addressed logical matrix according to direction d; on read operation, k elements from a row or a column of the addressed logical matrix appear on the macro-bank read data port according to direction d. A vector v constituted by two sub-vectors v'1 and v'0 are also shown.

As mentioned above, one advantage with the invention is that the logical memory space may be partitioned into a variable logic matrix size from memory access to memory access. This feature is useful for a number of matrix calculation operations.

As shown in FIG. 3, the memory space 20 holds N*N physical (and logical) memory elements 3. A memory element 3 constitutes an address for which an arbitrary value can be stored or read. On each memory access, memory elements 3 inside a logical matrix of size S*S are accessed. The logical memory space 20 is partitioned into non-overlapping logical matrices 30 of size S*S. The size parameter S, parameters R and C are supplied to identify the row and column of the addressed logical matrix. Within the addressed logical matrix, up to k elements are accessed. The address of the k elements (or K bits) is defined by parameters r and c which identify the sub-row and the sub-column within the addressed logical matrix. On each memory access, the matrix memory allows parallel access to k elements stored in either a row or a column of the logical matrix. The direction of the k-element vector v is defined by parameter d. As mentioned above, the vector v is dividable in two sub vectors v'0 and v'1.

The k consecutive memory elements of a logical matrix are accessed by using a logic address having the following access parameters:

S—Logical matrix size. For each access, the matrix memory is configured into an array of logical matrices of size S*S.

Pair (R, C)—Row and column of logical matrix in the memory space 20. For each access, the matrix row and column is indicated. The row and column parameters are valid for the address space configuration according to the matrix size S.

Pair (r, c)—Sub-row and sub-column inside the addressed logical matrix. Parameters r and c point at the first of k consecutive matrix elements.

There is moreover provided:

d—Direction. indicates row or column access.

Write enable mask we—Masks write operation for wd elements. we constitutes a k bits long write enable mask and can also be seen as bit map. Element i is stored in the matrix memory arrangement only if we(i)=1, otherwise the content is unchanged. The write enable mask we contains information on we(i) for a plurality of elements i.

Moreover, the addressing of row or a column within a logic matrix is constrained with a granularity equal to parameter G, c.f. FIG. 3. For row-wise access it is possible to access all sub-rows within the logical matrix, while sub-columns have to be multiples of G (e.g. 0, G, 2G . . . ). For column-wise access it is possible to access all sub-columns within the logical matrix, while sub rows are multiples of G. Or more formally:

$$d=0: \text{row access} \Rightarrow (c \bmod G)=0$$

$$d=1: \text{column access} \Rightarrow (r \bmod G)=0$$

Figure 4:
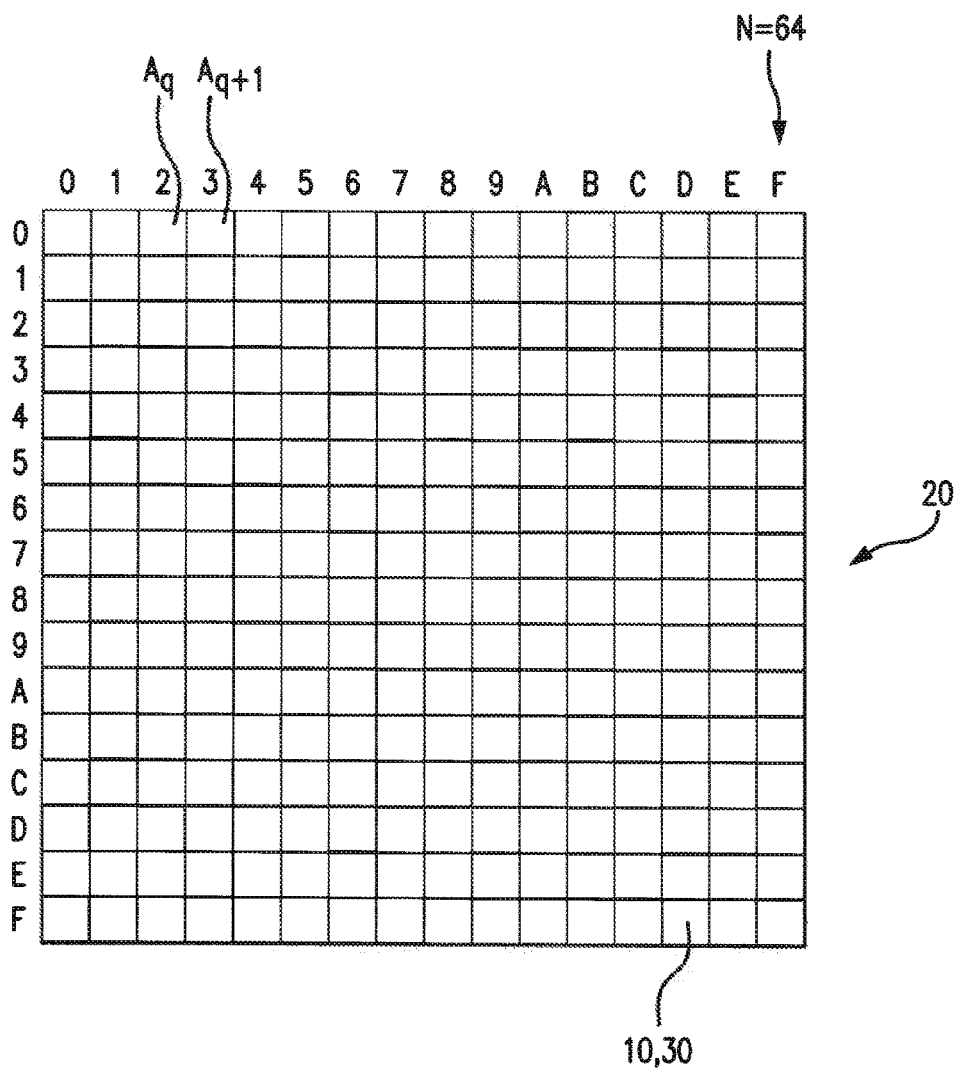
FIG. 4 shows one example according to a first embodiment of the invention on a memory space comprising 16 (F) times 16 (F) basic matrices, in a configuration where the logic matrix has the same size as the basic matrix, the basic matrix being of size 4×4 memory elements, corresponding to 4×4 elements.
Figure 5:
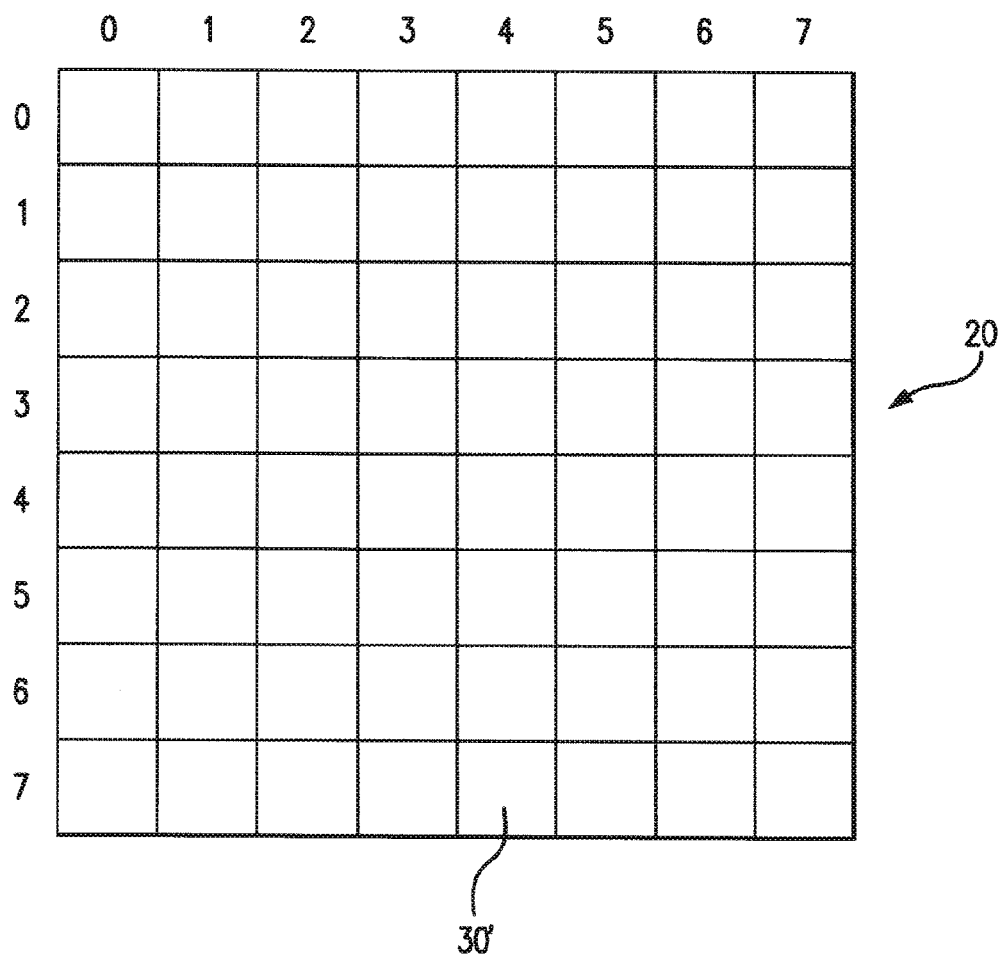
FIG. 5 shows the same memory space as in FIG. 4, but where the logic matrix size corresponds to 2×2 basic matrices, corresponding to 8×8 elements.
Figure 6:
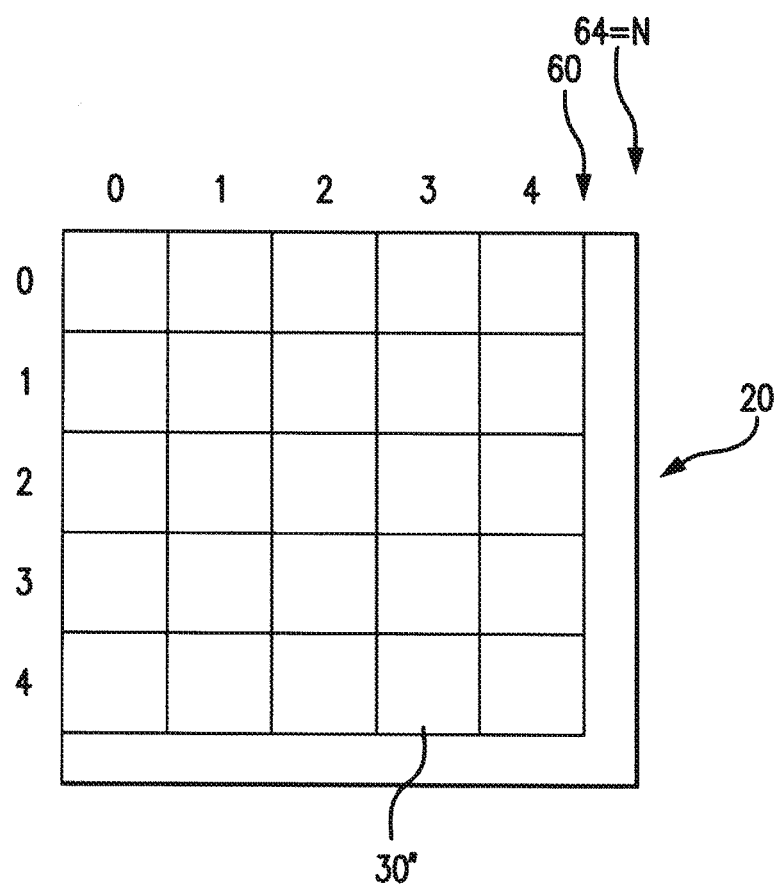
FIG. 6 shows the same memory space as in FIG. 4, but where the logic matrix size corresponds to 3×3 basic matrices, corresponding to 12×12 elements.

In FIGS. 4 to 6, the feature of the variable logical matrix size is illustrated.

FIG. 4 shows one example according to a first embodiment of the invention on a memory space comprising 16 (F)×16 (F) basic matrices, in a configuration where the logic matrix has the same size as the basic matrix, the basic matrix being of size 4×4 memory elements, corresponding to 4×4 elements.

FIG. 5 shows the same memory space as in FIG. 4, but where the logic matrix size 30' corresponds to 2×2 basic matrices, corresponding to 8×8 elements.

FIG. 6 shows the same memory space as in FIG. 4, but where the logic matrix size 30'' corresponds to 3×3 basic matrices, corresponding to 12×12 elements. In this implementation it is seen that only 60×60 elements out of 64×64 elements are used.

Memory Arrangement

Depending on the parameter k (maximum number of matrix elements that is desired to be accessed in parallel) the memory space is dimensioned so as to be mapped on B=ceil(k/G) macro-banks.

Basic matrix on row R and column C (using the same notation as for the logical matrix) is mapped on macro-bank b using the following function:

$$b=(R+C) \bmod B \quad (1)$$

As mentioned above, the memory space 20 is divided into non-overlapping basic matrices 10. As seen from for instance the FIG. 3 example, where only two macro banks are provided, each basic matrix is mapped on a respective macro bank, MB0 and MB1.

A macro-bank supports read and write operations and takes the following parameters:

Address $A_b$—Memory bank (basic matrix) address.

Row/column number a—Row or column number inside the $A_b$ basic matrix.

Write data wd—Write data (G memory cells).

Direction d—Indicates row or column access.

Read/write rw—Indicates read or write operation

Write enable mask we—Masks write operation for wd elements. we constitutes a k bits long write enable mask. An element is stored in the matrix memory arrangement only if we(i)=1.

When k consecutive matrix elements in the memory arrangement are addressed (on row R, column C, sub-row r and sub-column c) of the logical matrix, the first element is in a basic matrix according to the following relation providing a resolved address A:

$$A=R*N*S/G^2+\mathrm{floor}(r/G)*(N/G)+C*S/G+c \bmod G \quad (2)$$

The first summand is the number of basic matrices in R rows above the basic matrix A, the second summand is the number of basic matrices in sub-rows above the basic matrix A, the third and fourth summands are the number of basic matrices to the left and on the same row as basic matrix A. Generally it applies that the resolved address A points out the basic matrix enclosing v'0 vector. In the special case of the FIG. 3 example, the resolved address A points out the upper left basic matrix in a logical matrix 30 enclosing a vector v'0. If the whole matrix memory is divided in G*G (basic) matrices (as in FIG. 4) and those matrices are numbered from left to right (c.f. $A_q$ and $A_{q+1}$ in FIG. 4) and from up to down, the numbering would correspond to the resolved address A.

The k memory elements are distributed over B macro-banks. Macro bank address $A_b$ is used to address macro-bank number b:

$$A_b=A/B+(b-(A \bmod B)+B) \bmod B) \text{ for row access} \quad (3)$$

$$A_b=A/B+b*N/G/B \text{ for column access} \quad (4)$$

The k elements of a row or a column are mapped on macro-banks during write operation. Let v be a vector with k elements on the matrix memory write port. The vector v is partitioned into ceil(k/B) sub-vectors, v'0, v'1 ... v'B−1 (not shown). The sub-vectors are rotated $$A(0)=A \bmod B \quad (5)$$

positions (one position=one sub-vector) to the right. The rotated sub-vectors v'0, v'1, ..., v'B−1 are mapped on macro banks 0, 1, ..., B−1. Write enable mask we is also rotated to the right and the same number of positions as the write data.

Similarly, the data appearing on the macro-bank read ports in form of ceil(k/B) sub-vectors is rotated left to form a correctly permuted row or column (and as it appeared on matrix memory write port).

It should be noted that, the terms basic matrix, logic matrix, logic address and resolved address, are all terms which may not have an established meaning but which are used in this application for providing an economical and meaningful presentation of the invention. It should also be understood that other terms than basic, logic, resolved could have been chosen.

Figure 9:
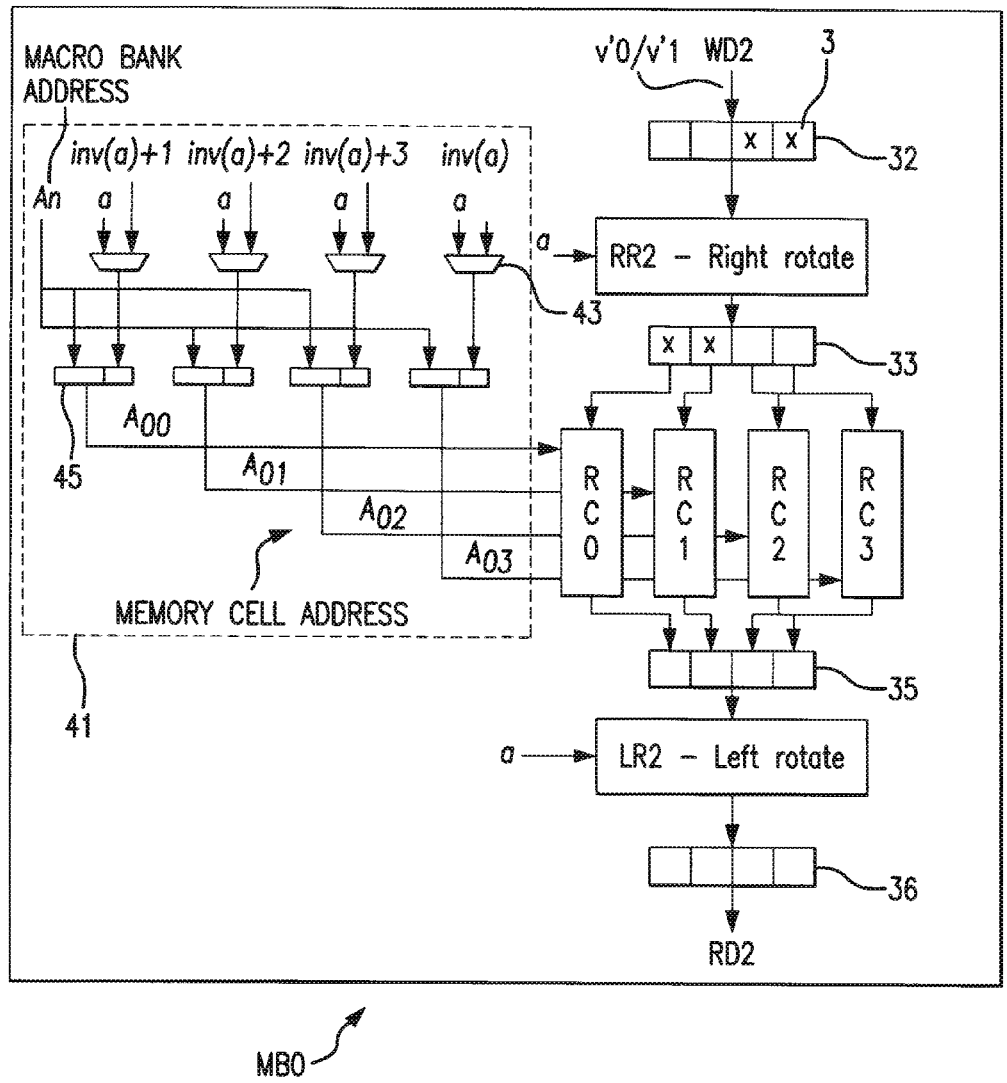
FIG. 9 shows macro bank MB0 of FIG. 7 in greater detail, the macro bank comprising a number of physical memory cells (RC0-RC3) such as standard RAM memory cells.

As mentioned above, the architecture is divided in two levels. The upper level of the memory arrangement according to the first embodiment, showing the matrix banks MB0 and MB1, is illustrated in FIG. 7, while the lower level, showing the memory cells RC0-RC3, is illustrated in FIG. 9.

Figure 7:
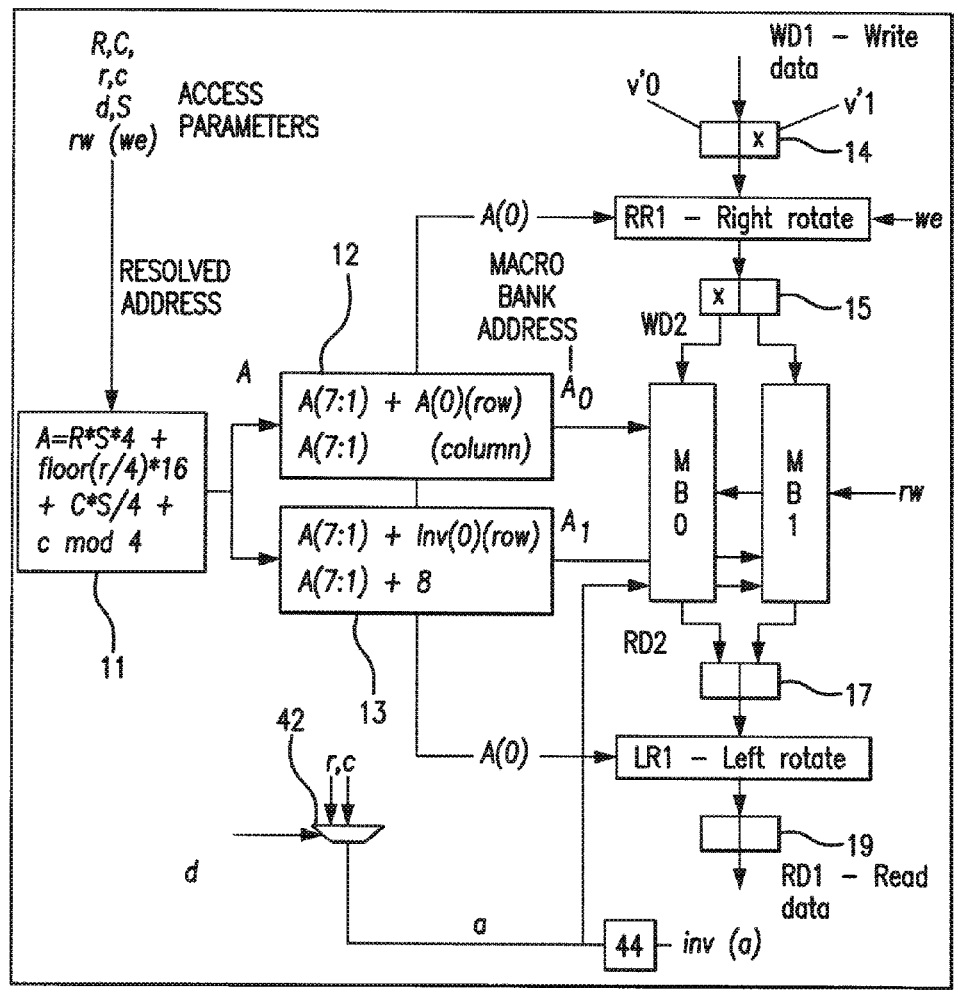
FIG. 7 shows a physical memory arrangement for the first embodiment of the invention comprising two macro-banks MB0 and MB1, for which the addressing scheme shown in FIG. 3 is used.

FIG. 7 shows a memory arrangement for the first embodiment of the invention comprising exemplary two macro-banks MB0 and MB1, configured for using the addressing scheme shown in FIG. 3.

As shown in FIG. 7, the memory arrangement 1 comprises a, logical address resolution stage 11, first algorithm function 12 and second algorithm function 13, macro banks MB0 and MB1, and first and second permutation blocks, RR1 and LR1. There are moreover indicated data structures 14, 15, 17 and 19, which corresponds to the processing of sub vectors v'0 and v'1. It should be understood that these data structures do not constitute hardware elements.

The access parameters denoted in the logical memory space 20 is provided to address resolution stage 11. In address resolution stage 11 operating according to (12), a resolved address A is resolved and delivered to first algorithm function 12 and second algorithm function 13. First algorithm function 12 provides a macro bank address $A_0$ to memory bank MB0 and second algorithm function 13 provides macro bank address $A_1$ to memory bank MB1. First algorithm function 12 operates acc. to (13) and (14) and second algorithm function 13 operates according to (15) and (16). The expressions (12)-(16) will be explained later below.

Algorithm function 12 provides further A(0) to RR1 and LR1.

During a write operation, a permutation of first write data elements WD1 (14) is performed in RR1. A(0)—bit 0 of resolved address A, see expression (5) below—is provided to RR1 giving a number of shift positions. The permuted data WD2 (15) is provided to write ports of macro banks MB0-MB1. For the embodiment with two macro banks in FIG. 7, the rotation in RR1 and LR1 is given by the binary value A(0), whereby a rotation of the two sub vectors v'0 and v'1 is made (as indicated by X). Alternatively, no rotation is done.

During a read operation, a permutation of first read data elements RD2 (17) provided from the read ports of macro banks MB0-MB1 is performed in LR1. Bit 0 of resolved address A—see (5), A(0), is provided to LR1 giving a number of shift positions so as provide permuted read data RD1 (19), being identical with the write data (WD1) originally entered in the memory arrangement.

The memory arrangement 1 moreover comprises multiplexer 42 operating on row r, column c, and direction d, of the access parameters for providing parameter a, defined in expressions (8) and (9) below. An inverter 44 provides an inverted value of a. The use of the values will be further explained below.

As shown in FIG. 7, the parameter we is provided to first permutation block, RR1, and parameter rw is provided both to the first and second macro bank.

Figure 8:
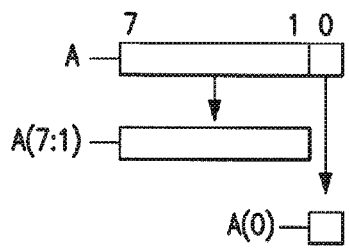
FIG. 8 is an illustration of parameters in FIG. 7.

FIG. 8 shows the data format for processing bits in the resolved address. A(7:1) corresponds e.g. to the most significant 6 bits in the resolved address, while A(0) corresponds to the least significant bit. This processing shown in FIG. 8 is done in stages 12 and 13.

Internally, each macro-bank is organized for parallel access to a row or column of a basic matrix. This is shown in FIG. 9, where the basic matrices are stored consecutively inside a macro-bank.

The elements 3 of each basic matrix 10 are mapped on G memory cells to allow parallel access to each basic matrix row or column. An element on row r and column c is mapped on memory cell number (r+c) mod G. The mapping of basic matrix elements on memory cells is shown in FIGS. 10 and 11, where elements 3 numbered 0-15 of basic matrix 10 is mapped further to memory cells RC0, RC1, RC2, and RC3. The resulting mapping of elements on memory cells is shown in FIG. 12. Here, it is seen that for any arbitrary selection of a row or a column a basic matrix, no memory cell is accessed more than once.

As shown in FIG. 9, the memory bank MB0 arrangement comprises a, macro bank logical address resolution stage 41, four memory cells RC0-RC3, and third and fourth permutation blocks, RR2 and LR2. There are moreover indicated vectors 32, 33, 35 and 36. It should be understood that these vectors do not constitute hardware elements, but indicate the format of data being processed. It will be understood that an identical arrangement is provided for memory bank MB1 (not shown).

Macro bank address resolution stage 41 receives the macro bank address $A_n$ shown in FIG. 7 (address will be explained below) and comprises a plurality of multiplexers 43 and a plurality of concatenating stages 45. The multiplexers and concatenation stages implement functions (6) and (7) and provide four memory cell addresses $A_{00}$, $A_{01}$; $A_{02}$, and $A_{03}$ to memory cells RC0-RC3. The multiplexers 43 receive the parameter -a- and the inverted value of -a- as shown in FIG. 7. Moreover, the third and fourth permutation blocks RR2 and LR2 are controlled by parameter a. As illustrated, numerical operations are carried out before multiplexing in multiplexers 43. The permutation of the read data is performed selectively and in accordance with the parameter a in RR2 block which shifts write data one position to the right. The permutation of read data is performed selectively and in accordance with the parameter a in LR2 block which shifts read data one position to the left. The number of shift positions to RR2 to LR2 is -a. If a=0 there is no rotation.

In other words there is provided, a memory arrangement having a plurality of memory elements, the elements being associated with a memory space which can be addressed in a row and column fashion during a write or a read access, the memory arrangement comprises a first macro bank comprising a first plurality of memory cells, the first plurality of memory cells comprising a first subset of the memory elements; a second macro bank comprising a second plurality of memory cells, the second plurality of memory cells comprising a second subset of the memory elements; an address resolution stage for addressing the memory cells in the respective macro banks, wherein the memory cells are arranged so that the memory space is partitioned into a plurality of non-overlapping basic matrices; whereby each basic matrix is mapped to a given macro bank and wherein the memory cells are arranged logically so that the memory space is partitioned into a plurality of non-overlapping logic matrices of a given size, each logic matrix being of a size equal or larger than a basic matrix. The address resolution stage is adapted for transforming a logic address as designating the location of the memory element in the logic matrix and the location of the logic matrix in the memory space and a direction indicating either row or column access of the memory space and the size of the logic matrix into a resolved address. The memory arrangement further comprises algorithm functions which transform the resolved address into a set of macro bank addresses, which by each macro bank again are transformed into a plurality of memory cell addresses. The memory cell addresses points out elements of given memory cells of each macro bank.

According to the invention and as shown in FIG. 13, there is provided a method comprising the steps of inputting, 1A, access parameters;

transforming, 2A, a logic address R, C, r, c, d, S as designating the location of the memory element 3 in the logic matrix r, c and the location of the logic matrix in the memory space R, C and a direction d indicating either row or column access of the memory space and the size S of the logic matrix into a resolved address A;

transforming, 3A, the resolved address A into a set of macro bank addresses $A_0$; $A_1$;

transforming, 4A, the set of macro bank addresses $A_0$; $A_1$ into a plurality of memory cell addresses, $A_{00}$, $A_{01}$, $A_{02}$, and $A_{03}$; the memory cell addresses pointing out elements 3 of given memory cells of each macro bank. The further details of the steps !a-4A, has been explained above and will further be elucidated below.

Figure 14:
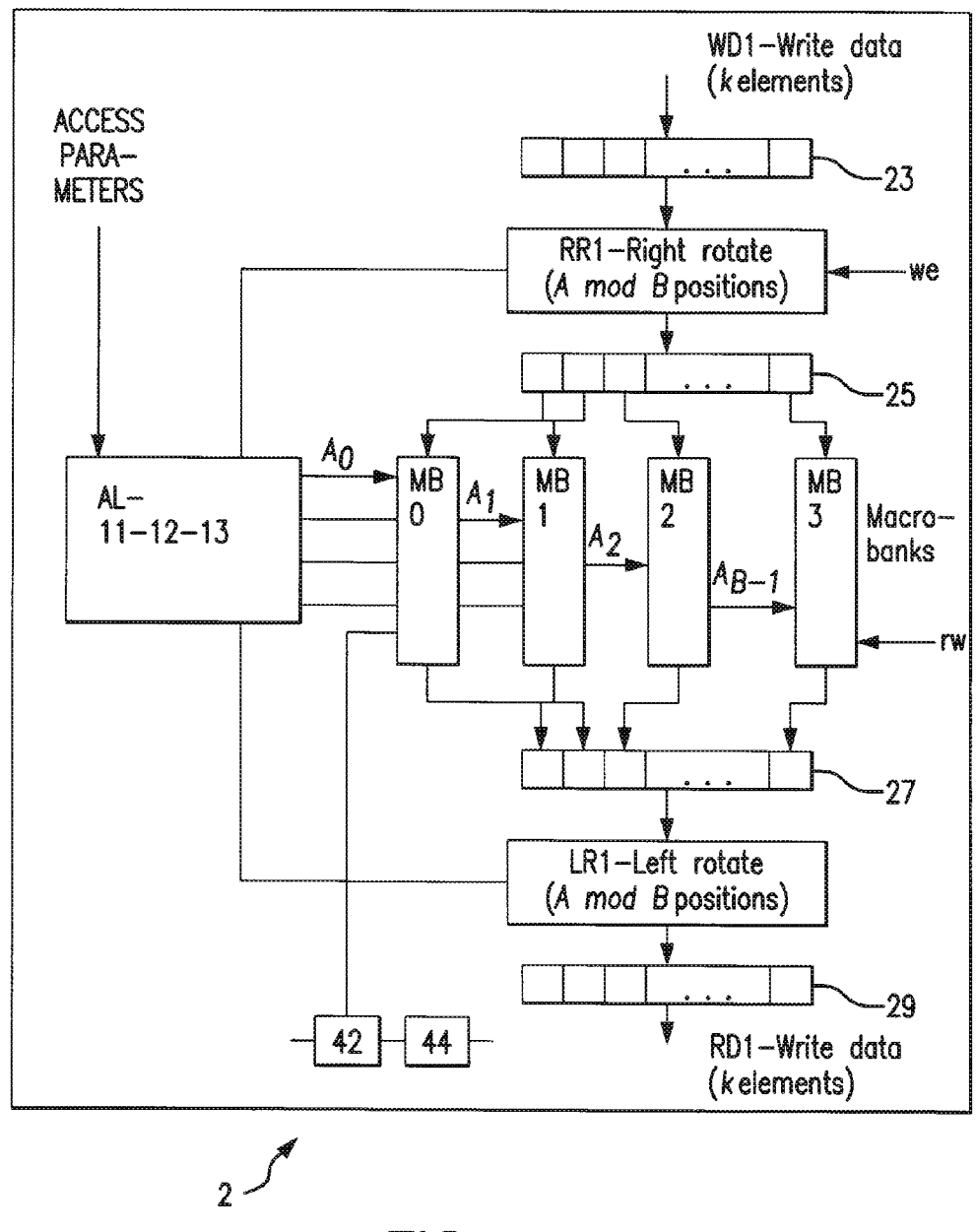
FIG. 14 shows a second embodiment of a physical memory arrangement of the invention wherein four macro-banks, MB0-MB3, are used.

In FIG. 14, a second embodiment is shown of a physical memory arrangement 2 of the invention wherein four macro-banks, MB0-MB3, are used. A stage AL provides the functionality of address a resolution stage 11, algorithm function 12 and further algorithm function 13, as shown and explained in connection with FIG. 7. Also multiplexer 42 and inverter 44 are provided and RR1 first block and LR1 second block. These functions are analogue to the first embodiment. Moreover, data structures 23, 25, 27 and 29 are shown which forms the further processing stages of vector v. Each macro bank MB0-MB3 may be arranged as shown in FIG. 9. The description of signals and functions with analogue functions as shown in FIG. 7 shall not be repeated here.

It applies generally, that each memory cell is addressed using the macro bank address $A_b$, row or column number a and direction d. The memory cell address $A_{bx}$ is used to address memory cell x.

$$A_{bx}=A_b*G+a \text{ if row access,} \tag{6}$$

$$A_{bx}=A_b*G+(x-a+G)\bmod G \text{ if column access,} \tag{7}$$

where $$a=r \text{ if row access, } d=0 \tag{8}$$

$$a=c \text{ if column access, } d=1 \tag{9}$$

Both macro-bank input and output data (read and write data) are rotated -a- positions: write data is rotated to the right while the read data is rotated to the left.

In the first embodiment of the invention shown in FIG. 9, each macro-bank is implemented using four memory cells. Hence, the memory elements 3 numbered 0-15 of a basic matrix 10 is mapped to the memory cells RC0, RC1, RC2 and RC3 of the first embodiment as shown in FIG. 10. For instance, it is shown that e.g. memory elements 0, 7, 10, 13 in the basic matrix 10 is mapped to memory cell RC0.

Each memory cell is indexed using memory cell address $A_{bx}$ where b is macro-bank number and x is memory cell number:

$$A_{bx}=A_b*4+a \text{ if row access} \quad (10)$$

$$A_{bx}=A_b*4+(x-a+4)\bmod 4 \text{ if column access} \quad (11)$$

The address $A_{bx}$ is formed by shifting $A_b$ two positions to the left and concatenating two bits. For row access a (a<4) is concatenated while for the column access the term (x−a+4) mod 4 is concatenated. (For column access the term (x−a+4) mod 4 is equivalent to (inverse(a)+x+1)mod 4 and is implemented as a two-bit adder.) Both input (read) and output (write) data are rotated a (0-3) positions.

In the above description of the first embodiment, general expressions are used. However, in the drawings relating to the first embodiment, a particular example is given which shall be further explained below:

Example Relating to the First Embodiment of the Invention

In the first embodiment shown in FIGS. 4-6, the matrix memory holds N*N=64*64 elements. The number of memory cells is 4; thus the size of the basic matrix G*G is 4*4 and supported matrix sizes are 4*4, 8*8, 12*12, 16*16, 32*32 and 64*64. Up to 8 elements are accessed on each access.

Macro-Bank Partitioning and Organization

Given the parameters N=64 (number of elements in each matrix memory row/column), G=4 (number of memory cells) and k=8 (maximum number of accessed elements in a matrix) the following is valid for macro-bank partitioning for the embodiment 1:

1. Basic matrix size is 4*4 (=G*G) memory elements, c.f. FIG. 10,
2. Matrix memory is partitioned in 16*16=(N/G)*(N/G) basic matrices, c.f. FIG. 4.
3. Number of macro-banks is B=ceil(k/G)=ceil(8/4)=2, c.f. FIG. 7.
4. Each macro-bank holds (N/G)*(N/G)/B=(16*16)/2=128 basic matrices.
5. Access parameters S, R, C, r and c are translated to the resolved addresses A using expression (2):

$$A=R*S*4+\text{floor}(r/4)*16+C*S/4+c \bmod 4 \quad (12)$$

The calculation of the resolved address A is efficiently implemented without carry propagation in addition of A. This is realized by analyzing a matrix memory when matrices of e.g. size S=16 are accessed. The first summand is multiple of 64 (number of basic matrices in rows above the addressed basic matrix) while the second summand is strictly less than 64 (number of basic matrices in sub-rows above the addressed basic matrix) and there is no carry propagation from summand two to summand one. Similarly, there is no carry propagation between the other summands. This property is valid for matrix memories whose size N and number of memory cells G are powers of two and allows for an efficient hardware implementation of a calculation of the resolved address A.

Macro-bank addresses $A_0$ and $A_1$ are according to (3) and (4) and after algebraic manipulation:

$$A_0(6:0)=A(7:1)+A(0) \text{ for row access} \quad (13)$$

$$A_0(6:0)=A(7:1) \text{ for column access} \quad (14)$$

$$A_1(6:0)=A(7:1)+\text{inverse}(A(0)) \text{ for row access} \quad (15)$$

$$A_1(6:0)=A(7:1)+8 \text{ for column access} \quad (16)$$

6. The macro-bank write data is rotated A(0) (=A mod 2) positions to the right, the read data is rotated A(0) position to the left. (The least significant bit of the address A is used to control write and read data rotation.)

The invention claimed is:

1. A memory arrangement having a plurality of memory elements, the elements being associated with a memory space which can be addressed in a row and column fashion during a write or a read access, the memory arrangement comprising
   a first macro bank comprising a first plurality of memory cells, the first plurality of memory cells comprising a first subset of the memory elements;
   a second macro bank comprising a second plurality of memory cells, the second plurality of memory cells comprising a second subset of the memory elements;
   an address resolution stage for addressing the memory cells in the respective macro banks, wherein
   the memory cells (p) are arranged so that the memory space is partitioned into a plurality of non-overlapping basic matrices; whereby each basic matrix is mapped to a given macro bank and wherein
   the memory cells (p) are arranged logically so that the memory space is partitioned into a plurality of non-overlapping logic matrices of a given size (S), each logic matrix being of a size equal or larger than a basic matrix;
   wherein the address resolution stage is adapted for transforming a logic address (R, C, r, c, d, S) as designating the location of the memory element in the logic matrix (r, c) and the location of the logic matrix in the memory space (R, C) and a direction (d) indicating either row or column access of the memory space and the size (S) of the logic matrix into a resolved address (A), the memory arrangement further comprising algorithm functions which transform the resolved address into a set of macro bank addresses ($A_0$; $A_1$), which by each macro bank again are transformed into a plurality of memory cell addresses ($A_{00}$, $A_{01}$; $A_{02}$, and $A_{03}$); the memory cell addresses pointing out elements of given memory cells of each macro bank.

2. Memory arrangement of claim 1, wherein the size (S) of the logic matrix may be changed from memory access to memory access.

3. Memory arrangement according to claim 1, wherein the partitioning of the memory space into basic matrices and the mapping of memory elements of each basic matrix on memory cells is such that
   for an access of reading or writing k memory elements of either a row or a column direction (d) covering at least two basic matrices, at least two different memory banks are accessed wherein for any said basic matrix any given memory cell is accessed only once, independently of whether a row or a column is accessed, thereby allowing for parallel access to said k elements.

4. Memory arrangement according to claim 1 wherein the resolved address (A) is calculated according to:

$$A=R*N*S/G2+\text{floor}(r/G)*(N/G)+C*S/G+c \bmod G \quad (2)$$

where R is the row of the logical matrix, N is the number of memory elements in one direction of the memory space, C is the column of the logical matrix, S is the size of the logical matrix, r is the row of the element in the logical matrix; c is the column of the element in the logical matrix, G is the size of the basic matrices.

5. Memory arrangement according to claim 4 wherein the macro banks address ($A_b$) for a respective macro-bank (b) is calculated according to:

$$A_b=A/B+(b-(A \bmod B)+B) \bmod B) \text{ for row access} \quad (3)$$

$$A_b=A/B+b*N/G/B \text{ for column access} \quad (4)$$

where B is the number of macro banks.

6. Memory arrangement according to claim 5, wherein k elements of a row or a column are mapped on macro-banks during write operation as a vector with k elements, the vector being partitioned into ceil(k/B) sub-vectors, whereby each sub-vector vector is rotated $$A(0)=A \bmod B \quad (5)$$

positions, corresponding to the length of a sub-vector, and wherein the rotated sub-vectors is mapped on different macro banks.

7. The memory arrangement according to claim 5, wherein the memory cell address $A_{bx}$ is used to address memory cell x according to $$A_{bx}=A_b*G+a \text{ if row access} \quad (6)$$

$$A_{bx}=A_b*G+(x-a+G) \bmod G\_\text{if column access} \quad (7)$$

where $$a=r \text{ if row access} \quad (8)$$

$$a=c \text{ if column access} \quad (9)$$

wherein row access or column access is determined by a direction d.

8. A memory arrangement according to claim 1 wherein the memory space is quadratic.

9. Memory arrangement according to claim 1, wherein the memory arrangement further comprises a, logical address resolution stage, first algorithm function and second algorithm function, and first and second permutation blocks.

10. Memory arrangement according to claim 9, wherein the access parameters (R, C, r, c, d, S) relating to the logical address is provided to the address resolution stage, wherein in address resolution stage, the resolved address (A) is resolved and delivered to the first algorithm function and the second algorithm function, wherein the first algorithm function provides the macro bank address ($A_0$) to the first memory bank and the second algorithm function provides the macro bank address ($A_1$) to the second memory bank.

11. Memory arrangement according to claim 6, wherein the first algorithm function provides further the least significant bit of the resolved address (A(0)) to the first and second permutation blocks.

12. Memory arrangement according to claim 11, wherein only two macro banks are provided, the rotation in the first and the second permutation blocks being given by the least significant bit of the resolved address (A(0)), whereby a rotation of the two sub vectors is made or no rotation is done, the potentially rotated sub vectors being provided to the respective macro banks.

13. Memory arrangement according to claim 12, wherein during a read operation, a permutation of first read data elements provided from read ports of macro banks is performed in second permutation block, wherein Bit 0 of resolved address A, A(0), is provided to second permutation block, giving a number of shift positions so as provide permuted read data, being identical with the write data originally entered in the memory arrangement.

14. Method for a memory arrangement having a plurality of memory elements, the elements being associated with a memory space which can be addressed in a row and column fashion during a write or a read access, the memory arrangement comprising a first macro bank comprising a first plurality of memory cells, the first plurality of memory cells comprising a first subset of the memory elements;

a second macro bank comprising a second plurality of memory cells, the second plurality of memory cells comprising a second subset of the memory elements;

address resolution stage for addressing the memory cells in the respective macro banks, wherein the memory cells (p) are arranged so that the memory space is partitioned into a plurality of non-overlapping basic matrices; whereby each basic matrix is mapped to a given macro bank and wherein the memory cells (p) are arranged logically so that the memory space is partitioned into a plurality of non-overlapping logic matrices of a given size (S), each logic matrix being of a size equal or larger than a basic matrix;

the method comprising the steps of transforming a logic address (R, C, r, c, d, S) as designating the location of the memory element in the logic matrix (r, c) and the location of the logic matrix in the memory space (R, C) and a direction (d) indicating either row or column access of the memory space and the size (S) of the logic matrix into a resolved address (A), transforming the resolved address (A) into a set of macro bank addresses ($A_0$; $A_1$), transforming the set of macro bank addresses ($A_0$; $A_1$) into a plurality of memory cell addresses ($A_{00}$, $A_{01}$; $A_{02}$, and $A_{03}$); the memory cell addresses pointing out elements of given memory cells of each macro bank.

15. Method according to claim 14, wherein the resolved address (A) is calculated according to:

$$A=R*N*S/G2+\text{floor}(r/G)*(N/G)+C*S/G+c \bmod G \quad (2)$$

where R is the row of the logical matrix, N is the number of memory elements in one direction of the memory space, C is the column of the logical matrix, S is the size of the logical matrix, r is the row of the element in the logical matrix; c is the column of the element in the logical matrix, G is the size of the basic matrices.

16. Method according to claim 15, wherein the macro banks address (Ab) for a respective macro-bank (b) is calculated according to:

$$Ab=A/B+(b-(A \bmod B)+B) \bmod B) \text{ for row access} \quad (3)$$

$$Ab=A/B+b*N/G/B\_\text{for column access} \quad (4)$$

where B is the number of macro banks.

17. Method according to claim 16, wherein k elements of a row or a column are mapped on macro-banks during write operation as a vector with k elements, the vector being partitioned into ceil(k/B) sub-vectors, whereby each sub-vector vector is rotated $$A(0)=A \bmod B \quad (5)$$

positions, corresponding to the length of a sub-vector, and wherein the rotated sub-vectors is mapped on different macro banks.

18. Method according to claim 16, wherein the memory cell address (Abx) is used to address memory cell x according to $$Abx=Ab*G+a \text{ if row access} \quad (6)$$

$$Abx=Ab*G+(x-a+G) \bmod G\_\text{if column access} \quad (7)$$

where $$a=r \text{ if row access} \quad (8)$$

$a = c$ if column access  (9)

wherein row access or column access is determined by a direction d.

* * * * *

UNITED STATES PATENT AND TRADEMARK OFFICE
CERTIFICATE OF CORRECTION

| | |
|---|---|
| PATENT NO. | : 8,441,883 B2 |
| APPLICATION NO. | : 12/939010 |
| DATED | : May 14, 2013 |
| INVENTOR(S) | : Catovic et al. |

It is certified that error appears in the above-identified patent and that said Letters Patent is hereby corrected as shown below:

On the Title Page, Item (75), under "Inventors", in Column 1, Line 2, delete "Vastra Frolunda" and insert -- Västra Frölunda --, therefor.

In the Specification

In Column 1, Line 43, delete "exampled" and insert -- example --, therefor.

In Column 7, Line 56, in Equation (3), delete "mod B)" and insert -- mod B --, therefor.

In Column 10, Line 29, delete "!a-4A," and insert -- 1A-4A, --, therefor.

In the Claims

In Column 12, Line 10, in Claim 1, delete "comprising" and insert -- comprising: --, therefor.

In Column 12, Line 41, in Claim 2, delete "Memory" and insert -- The memory --, therefor.

In Column 12, Line 44, in Claim 3, delete "Memory" and insert -- The memory --, therefor.

In Column 12, Line 55, in Claim 4, delete "Memory" and insert -- The memory --, therefor.

In Column 12, Line 65, in Claim 5, delete "Memory" and insert -- The memory --, therefor.

In Column 13, Line 1, in Claim 5, in Equation (3), delete "mod B)" and insert -- mod B --, therefor.

In Column 13, Line 5, in Claim 6, delete "Memory" and insert -- The memory --, therefor.

In Column 13, Line 29, in Claim 8, delete "A memory" and insert -- The memory --, therefor.

In Column 13, Line 31, in Claim 9, delete "Memory" and insert -- The memory --, therefor.

Signed and Sealed this
Eighth Day of October, 2013

Teresa Stanek Rea
*Deputy Director of the United States Patent and Trademark Office*

CERTIFICATE OF CORRECTION (continued)
U.S. Pat. No. 8,441,883 B2

In Column 13, Line 35, in Claim 10, delete "Memory" and insert -- The memory --, therefor.

In Column 13, Line 44, in Claim 11, delete "Memory" and insert -- The memory --, therefor.

In Column 13, Line 48, in Claim 12, delete "Memory" and insert -- The memory --, therefor.

In Column 13, Line 55, in Claim 13, delete "Memory" and insert -- The memory --, therefor.

In Column 13, Line 63, in Claim 14, delete "Method" and insert -- A method --, therefor.

In Column 13, Line 67, in Claim 14, delete "comprising" and insert -- comprising: --, therefor.

In Column 14, Line 30, in Claim 15, delete "Method" and insert -- The method --, therefor.

In Column 14, Line 38, in Claim 15, delete "matrix;" and insert -- matrix, --, therefor.

In Column 14, Line 40, in Claim 16, delete "Method" and insert -- The method --, therefor.

In Column 14, Line 43, in Claim 16, in Equation (3), delete "mod B)" and insert -- mod B --, therefor.

In Column 14, Line 48, in Claim 17, delete "Method" and insert -- The method --, therefor.

In Column 14, Line 58, in Claim 18, delete "Method" and insert -- The method --, therefor.